United States Patent
Hori et al.

(10) Patent No.: US 11,871,671 B2
(45) Date of Patent: Jan. 9, 2024

(54) ASSEMBLY OF PIEZOELECTRIC MATERIAL SUBSTRATE AND SUPPORTING SUBSTRATE, AND METHOD FOR MANUFACTURING SAME

(71) Applicant: NGK INSULATORS, LTD., Nagoya (JP)

(72) Inventors: Yuji Hori, Owariasahi (JP); Takahiro Yamadera, Nagoya (JP); Tatsuro Takagaki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 755 days.

(21) Appl. No.: 16/934,460

(22) Filed: Jul. 21, 2020

(65) Prior Publication Data
US 2020/0350485 A1  Nov. 5, 2020
US 2021/0265558 A9  Aug. 26, 2021

Related U.S. Application Data

(63) Continuation of application No. PCT/JP2018/042630, filed on Nov. 19, 2018.

(30) Foreign Application Priority Data

Jan. 22, 2018  (JP) .................................. 2018-007912

(51) Int. Cl.
*H10N 30/072*  (2023.01)
*H10N 30/086*  (2023.01)
*H10N 30/853*  (2023.01)

(52) U.S. Cl.
CPC ......... *H10N 30/072* (2023.02); *H10N 30/086* (2023.02); *H10N 30/8542* (2023.02)

(58) Field of Classification Search
CPC .............. H10N 30/072; H10N 30/086; H10N 30/8542; H10N 30/10516; H03H 3/08; H03H 9/25; H03H 9/02574; H03H 9/171
See application file for complete search history.

(56) References Cited

U.S. PATENT DOCUMENTS 8,907,547 B2 * 12/2014 Tai ....................... H10N 30/072
                                                          310/358
9,385,301 B2    7/2016 Kando et al.
(Continued)

FOREIGN PATENT DOCUMENTS

CN          102738339 A  * 10/2012
CN          108863171 A  * 11/2018
(Continued)

OTHER PUBLICATIONS

Xu et al., "Glass on LiNbO3 heterostructure formed via a two-step plasma activated low-temperature direct bonding method", Aug. 4, 2018, Applied Surface Science, ed. 459, pp. 621-623.*
(Continued)

*Primary Examiner* — Jeffrey T Carley
(74) *Attorney, Agent, or Firm* — FLYNN THIEL, P.C.

(57) ABSTRACT

A bonded body includes a supporting substrate, a silicon oxide layer provided on the supporting substrate, and a piezoelectric material substrate provided on the silicon oxide layer and composed of a material selected from the group consisting of lithium niobate, lithium tantalate and lithium niobate-lithium tantalate. The surface resistivity of the piezoelectric material substrate on the side of the silicon oxide layer is $1.7 \times 10^{15} \Omega/\square$ or higher.

5 Claims, 3 Drawing Sheets

(56) References Cited

U.S. PATENT DOCUMENTS

| | | | |
|---|---|---|---|
| 2004/0095038 A1 | 5/2004 | Takase et al. | |
| 2004/0226162 A1 | 11/2004 | Miura et al. | |
| 2005/0045471 A1* | 3/2005 | Noguchi | C23C 14/0042 |
| | | | 204/192.15 |
| 2005/0194864 A1* | 9/2005 | Miura | H10N 30/072 |
| | | | 310/313 R |
| 2007/0028433 A1 | 2/2007 | Abbott et al. | |
| 2016/0349088 A1 | 12/2016 | Patel | |
| 2018/0102755 A1 | 4/2018 | Takamine | |
| 2018/0175283 A1 | 6/2018 | Akiyama et al. | |
| 2019/0036008 A1 | 1/2019 | Tai et al. | |

FOREIGN PATENT DOCUMENTS

| | | | |
|---|---|---|---|
| JP | 2001168676 A | 6/2001 | |
| JP | 3774782 B2 | 12/2004 | |
| JP | 2006319679 A | 11/2006 | |
| JP | 201068484 A | 3/2010 | |
| JP | 2016225537 A | 12/2016 | |
| WO | 2013031651 A1 | 3/2013 | |
| WO | 2016208236 A1 | 12/2016 | |
| WO | 2017163723 A1 | 9/2017 | |
| WO | WO-2019130857 A1 * | 7/2019 | B32B 9/00 |

OTHER PUBLICATIONS

Yoshikaju Zikuhara et al., Sequential activation process of oxygen RIE and nitrogen radical for LiTaO3 and Si wafer bonding, ECS Transactions, 3 (6) 91-98 (2006) (8 pages).

T. Plach et al., Mechanisms for room temperature direct wafer bonding, Journal of Applied Physics 113, 094905 (2013) (8 pages).

International Search Report with English Translation issued in corresponding International Application No. PCT/JP2018/042630 dated Jan. 29, 2019 (5 pages).

Written Opinion of International Searching Authority issued in corresponding International Application No. PCT/JP2018/042630 dated Jan. 29, 2019 (4 pages).

Korean Office Action with English Translation issued in corresponding Korean Application No. 10-2020-7020678 dated Jan. 26, 2022 (11 pages).

Taiwan Office Action issued in corresponding Taiwan Application No. 11120213280 dated Mar. 3, 2022 (7 pages).

International Preliminary Report on Patentability and Written Opinion issued in corresponding International Application No. PCT/JP2018/042630, with English translation, dated Aug. 6, 2020 (13 pages).

* cited by examiner (a)

(b)

ASSEMBLY OF PIEZOELECTRIC MATERIAL SUBSTRATE AND SUPPORTING SUBSTRATE, AND METHOD FOR MANUFACTURING SAME

CROSS-REFERENCE TO RELATED APPLICATIONS

This is a continuation of PCT/JP2018/042630, filed Nov. 19, 2018, which claims priority from Japanese Application No. 2018-007912, filed Jan. 22, 2018, the entire contents of which are hereby incorporated by reference.

TECHNICAL FIELD

The present invention relates to a bonded body of a piezoelectric material substrate and supporting substrate, and a method of producing the same.

BACKGROUND ARTS

It has been widely used an SOI substrate composed of a high resistance $Si/SiO_2$ thin film/Si thin film, for realizing a high-performance semiconductor device. Plasma activation is used for realizing the SOI substrate. This is because the bonding can be realized at a relatively low temperature (400° C.). It is proposed a composite substrate composed of similar $Si/SiO_2$ thin film/piezoelectric thin film for improving the characteristics of a piezoelectric device (patent document 1).

According to patent document 1, a piezoelectric material substrate composed of lithium niobate or lithium tantalate and silicon substrate with a silicon oxide layer formed thereon are activated by ion activation method, followed by the bonding.

According to patent document 2, it is described that lithium tantalate and sapphire or a ceramic material containing, as a main component, aluminum oxide, aluminum nitride or silicon nitride are bonded through a silicon oxide layer by plasma activation method.

According to non-patent document 1, it is described that lithium tantalate substrate and a silicon substrate with a silicon oxide layer provided thereon are bonded with each other by irradiating $O_2$ plasma of RIE (13.56 MHz) and microwave (2.45 GHz) of $N_2$ in series.

When Si and $SiO_2$/Si are bonded with each other by plasma activation, a sufficiently high bonding strength is obtained by the formation of Si—O—Si bond at the bonding interface. Further, at the same time, Si is oxidized to $SiO_2$ so that the flatness is improved and the bonding as described above is facilitated at the uppermost surface (Non-patent document 2).

RELATED TECHNICAL DOCUMENTS

Non-Patent Documents (Non-patent document 1)
ECS Transactions, 3 (6) 91-98 (2006)
(Non-patent document 2)
J. Applied Physics 113, 094905 (2013)

Patent Documents (Patent document 1) Japanese Patent Publication No. 2016-225537A (Patent document 2) Japanese Patent No. 3774782B

SUMMARY OF THE INVENTION

As described in the prior documents, in the case that a piezoelectric device is produced by thinning a lithium niobate or lithium tantalate substrate by ion injection, the performance is poor which is problematic. This is because that the crystallinity is deteriorated due to the damage during the ion injection.

On the other hand, in the case that a piezoelectric material substrate such as lithium niobate or lithium tantalate is bonded to a silicon oxide layer on a silicon substrate and that the piezoelectric material substrate is then polished to make the substrate thinner, a processing denatured layer can be removed by CMP so that the device performance is not deteriorated. However, during the polishing, a large shearing stress is exerted onto the piezoelectric material substrate. Thus, as it is tried to process the piezoelectric material substrate thinner by polishing, the piezoelectric material substrate is separated from the silicon substrate during the polishing, which is problematic. Further, as the thickness of the piezoelectric material substrate is reduced by polishing, there was the problem that the performance of the thus obtained bonded body was deteriorated. In particular, in the case that the bonded body is used for an acoustic wave device, the performance as the acoustic wave device (for example, electromechanical coupling factor k2) may be deteriorated.

An object of the present invention is, in bonding a piezoelectric material substrate, composed of a material selected from the group consisting of lithium niobate, lithium tantalate and lithium niobate-lithium tantalate, and a supporting substrate with a silicon oxide layer provided thereon, to suppress the deterioration of the performance of a bonded body while maintaining the bonding strength.

The present invention provides a bonded body comprising:
a supporting substrate;
a silicon oxide layer provided on the supporting substrate; and
a piezoelectric material substrate provided on the silicon oxide layer and comprising a material selected from the group consisting of lithium niobate, lithium tantalate and lithium niobate-lithium tantalate,
wherein the piezoelectric material substrate on a side of the silicon oxide layer has a surface resistivity of $1.7 \times 10^{15} \Omega/\square$ or higher.

The present invention further provides a method of bonding a piezoelectric material substrate and a supporting substrate with a silicon oxide layer provided thereon, the piezoelectric material substrate comprising a material selected from the group consisting of lithium niobate, lithium tantalate and lithium niobate-lithium tantalate, the method comprising the steps of:
irradiating an oxygen plasma onto a bonding surface of the piezoelectric material substrate at a temperature of 150° C. or lower to make a surface resistivity of the bonding surface $1.7 \times 10^{15}/\square$ or higher; and
then bonding said bonding surface of the piezoelectric material substrate to a bonding surface of the silicon oxide layer.

As the piezoelectric material substrate composed of lithium niobate or the like and the supporting substrate with the silicon oxide layer provided thereon are directly bonded with each other, the inventors studied in detail the reason that it is difficult to suppress the deterioration of the performance (for example, electromechanical coupling factor k2) of the bonded body while maintaining the bonding strength at a some degree and reached the following findings.

That is, in the case that Si and SiO$_2$/Si are bonded by plasma activation, for example, Si—O—Si bond is formed along the bonding interface, resulting in a sufficiently high bonding strength. Further, Si is oxidized into SiO$_2$ at the same time, so that the flatness is improved and the bonding as described above is facilitated at the uppermost surface (non-patent document 2: J. Applied Physics 113, 094905 (2013)).

Contrary to this, in the case that lithium niobate or lithium tantalate is directly bonded to the supporting substrate with a silicon oxide layer formed thereon, Ta—(Nb)—O—Si bond is formed along the bonding interface to perform the bonding. However, the density of Si atoms at the uppermost surface of SiO$_2$/Si is 6.8 counts/Å$^2$. On the other hand, the density of Ta(Nb) atoms at the uppermost surface of the piezoelectric material substrate is 4.3 counts/Å$^2$ or lower, for example, indicating that the atomic density at the uppermost surface is low, although the density is dependent on the cut angle as the crystal belongs to anisotropic crystal. Further, it is considered that lithium niobate or lithium tantalate does not have the mechanism of smoothening by oxidation, different from silicon, and that a sufficiently high bonding strength is thus not obtained.

As a result, in the case that a piezoelectric material substrate composed of lithium niobate or lithium tantalate is processed after the piezoelectric material substrate is directly bonded to SiO$_2$/Si, as the piezoelectric material substate becomes thinner, a shearing force is exerted on the piezoelectric material substrate, resulting in the deterioration of the piezoelectric material substrate.

Based on such speculation, the inventors tried to irradiate oxygen plasma onto the bonding surfaces of the piezoelectric material substrate and of the silicon oxide layer at a temperature of 150° C. or lower for 30 minutes or longer to activate the bonding surfaces, and then to directly bond the activated surfaces of the piezoelectric material substrate and of the silicon oxide layer. The surface resistivity of the piezoelectric material substrate on the side of the silicon oxide layer is thereby made $1.7 \times 10^{1\ 5} \Omega/\square$ or higher. As a result, it is found that the deterioration of the performance (electromechanical coupling factor k2) of the bonded body can be suppressed while actually maintaining the bonding strength of the piezoelectric material substrate and supporting substrate. The present invention is thus made.

EMBODIMENTS FOR CARRYING OUT THE INVENTION

The present invention will be described in detail, appropriately referring to drawings.

Figure 1A:
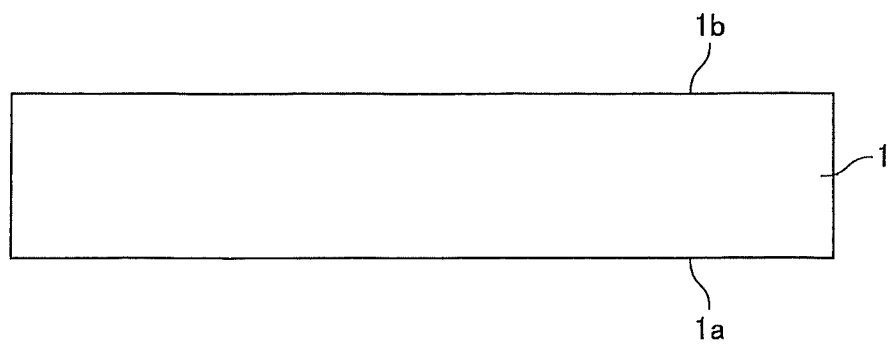
FIG. 1(a) shows a piezoelectric material substrate 1.
Figure 1B:
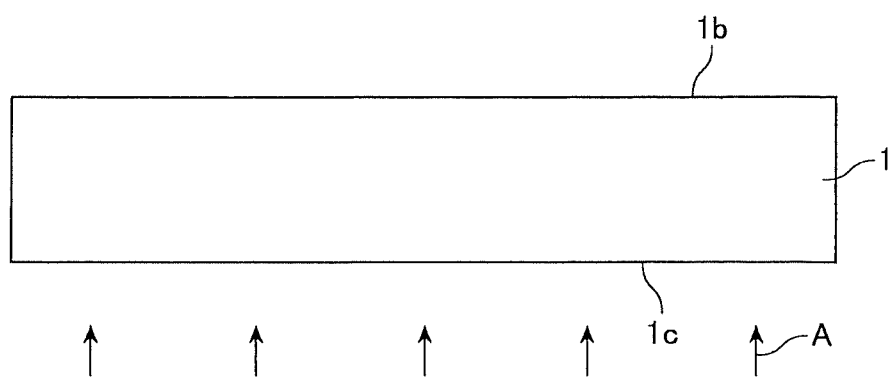
FIG. 1(b) shows the state that a bonding surface 1a of the piezoelectric material substrate 1 is activated to generate an activated surface 1c.

First, as shown FIG. 1(a), it is prepared a piezoelectric material substrate 1 having a pair of main surfaces 1a and 1b. 1a is made a bonding surface according to the present example. Then, as shown in FIG. 1(b), plasma is irradiated onto a bonding surface 1a of the piezoelectric material substrate 1 as an arrow A to obtain a surface-activated bonding surface 1c.

Figure 2A:
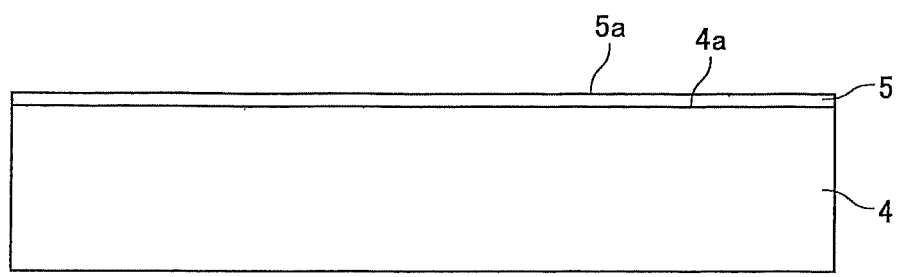
FIG. 2(a) shows the state that a silicon oxide layer 5 is formed on a surface of a supporting substrate 4.
Figure 2B:
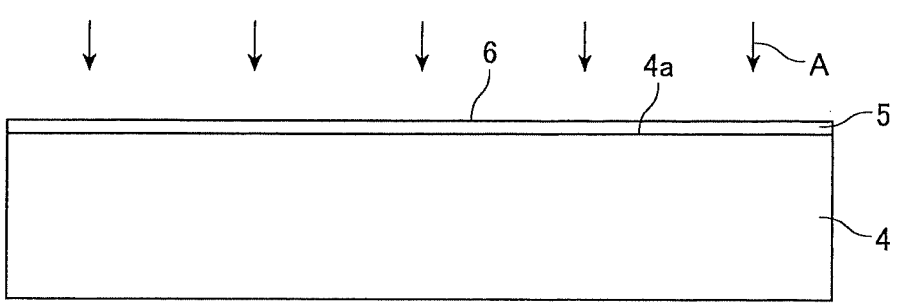
FIG. 2(b) shows the state that a silicon oxide layer 5 is subjected to surface activation.

On the other hand, as shown in FIG. 2(a), a silicon oxide layer 5 is formed on a surface 4a of a supporting substrate 4. Then, as shown in FIG. 2(b), plasma is irradiated onto a surface 5a of the silicon oxide layer 5 as an arrow A to perform the surface activation to form an activated bonding surface 6.

Figure 3A:
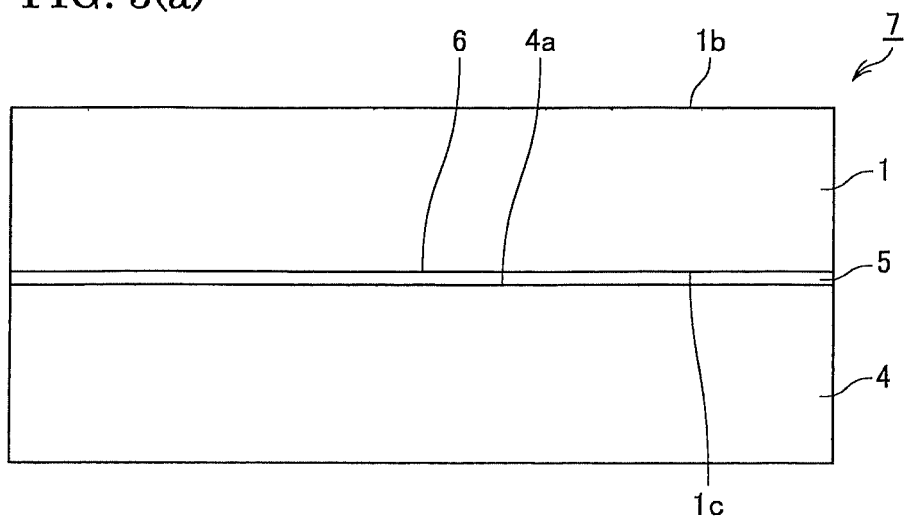
FIG. 3(a) shows a bonded body 7 obtained by directly bonding the piezoelectric material substrate 1 and the silicon oxide layer 5 on the supporting substrate 4.
Figure 3B:
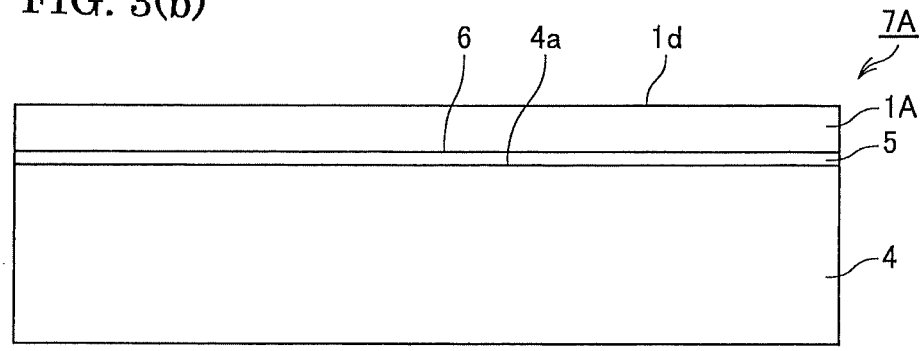
FIG. 3(b) shows the state that a piezoelectric material substrate 1A of the bonded body 7 is polished and thinned.
Figure 3C:
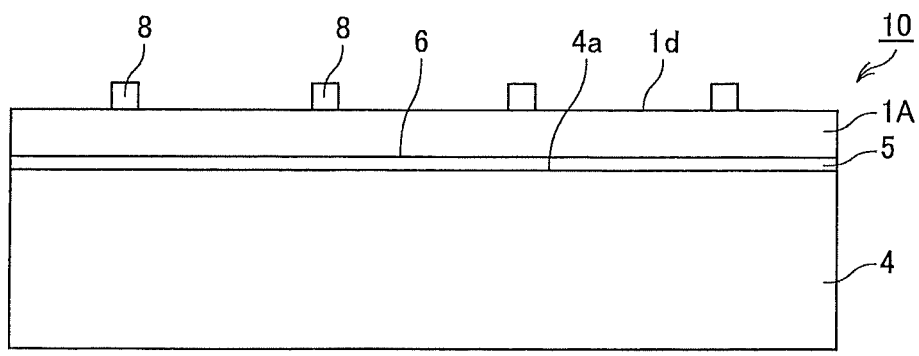
FIG. 3(c) shows an acoustic wave device 10.

Then, as shown in FIG. 3(a), the activated bonding surface 1c of the piezoelectric material substrate 1 is contacted with and directly bonded with the activated bonding surface 6 of the silicon oxide layer 5 on the supporting substrate 4 to obtain a bonded body 7. At this stage, an electrode may be provided on the piezoelectric material substrate 1. However, preferably, as shown in FIG. 3(b), the main surface 1b of the piezoelectric material substrate 1 is processed to thin the substrate 1 to obtain a thinned piezoelectric material substrate 1A. 1d represents a processed surface. Then, as shown in FIG. 3(c), predetermined electrodes 8 are formed on the processed surface 1d of the piezoelectric material substrate 1 of the bonded body 7A to obtain an acoustic wave device 10.

The respective constituents of the present invention will be described further in detail below.

Although the material of the supporting substrate 4 is not particularly limited, preferably, the material is selected from the group consisting of silicon, quartz, sialon, mullite, sapphire and translucent alumina. It is thus possible to further improve the frequency characteristics of the acoustic wave device 10.

The silicon oxide layer 5 is formed on the supporting substrate 4. Although the method of film-forming the silicon oxide layer 5 is not particularly limited, sputtering, chemical vapor deposition (CVD) and vapor deposition may be listed. Preferably, the supporting substrate 4 is a silicon substrate, and in this case, the silicon oxide layer 5 can be formed by sputtering or ion injection of oxygen onto the surface of the silicon substrate, or by heating under oxidizing atmosphere.

The thickness of the silicon oxide layer 5 may preferably be 0.05 µm or larger, more preferably be 0.1 µm or larger and particularly preferably be 0.2 µm or larger, on the viewpoint of the present invention. Further, the thickness of the silicon oxide layer 5 may preferably be 3 µm or smaller, preferably be 2.5 µm or smaller and more preferably be 2.0 µm or smaller.

The piezoelectric material substrate 1 used in the present invention is made single crystals of lithium tantalate (LT), lithium niobate (LN) or lithium niobate-lithium tantalate solid solution. As the materials have high propagation speeds of a surface acoustic wave and large electro-mechanical coupling factors, it is preferred for use in a piezoelectric surface wave device for high frequency and wideband frequency applications.

Further, the normal direction of the main surfaces 1a and 1b of the piezoelectric single crystal substrate 1 is not limited. For example, in the case that the piezoelectric material substrate 1 is made of LT, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. In the case that the piezoelectric single crystal substrate 1 is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate is not particularly limited, for example, the diameter may be 100 to 200 mm and thickness may be 0.15 to 1 μm.

Oxygen plasma is then irradiated onto the bonding surface 1a of the piezoelectric material substrate 1 at a temperature of 150° C. or lower to activate the bonding surface 1a.

The pressure during the surface activation may preferably be 100 Pa or lower and more preferably be 80 Pa or lower. Further, the atmosphere may be composed of oxygen only, or may contain nitrogen in addition to oxygen.

The temperature during the irradiation of the oxygen plasma is made 150° C. or lower. It is thereby possible to obtain the bonded body 7 having a high bonding strength and no deterioration of the piezoelectric material substrate. On the viewpoint, the temperature during the oxygen plasma irradiation is made 150° C. or lower and may more preferably be 100° C. or lower.

Further, the energy of the irradiated oxygen plasma may preferably be 100 to 150 W. Further, a product of the energy of the irradiated oxygen plasma and irradiation time duration may preferably be 20 to 50 Wh. Further, the time duration of the irradiation of the oxygen plasma may preferably be 30 minutes or longer.

According to a preferred embodiment, the bonding surface 1a of the piezoelectric material substrate 1 and the bonding surface 5a of the silicon oxide layer 5 are subjected to flattening process before the plasma treatment. The method of flattening the respective bonding surfaces 1a and 5a includes lapping, chemical mechanical polishing (CMP) and the like. Further, the flattened surface may preferably have Ra of 1 nm or lower and more preferably have Ra of 0.3 nm or lower.

According to a preferred embodiment, the surface resistivity of the piezoelectric material substrate 1 after the oxygen plasma treatment is made $1.7 \times 10^{15} \Omega/\square$ or higher and preferably made $2.8 \times 10^{15} \Omega/\square$ or higher. As oxygen is incorporated into the piezoelectric material substrate 1, the surface resistivity measured at the bonding surface 1a becomes higher. The surface resistivity can be thus used as an indication of the incorporation of oxygen. Further, the surface resistivity of the piezoelectric material substrate 1 after the oxygen plasma treatment is made $2.0 \times 10^{16} \Omega/\square$ or lower so that the bonding strength of the bonded body can be maintained. On such viewpoint, the surface resistivity of the piezoelectric material substrate 1 may more preferably be $1.6 \times 10^{16} \Omega/\square$ or lower. By this, it is easily possible to polish the piezoelectric material substrate 1.

The bonding surface 5a of the silicon oxide layer 5 is also subjected to plasma treatment. At this time, it may be used plasma of oxygen, nitrogen or the like. Further, the temperature during the plasma treatment may preferably be 150° C. or lower and more preferably be 100° C. or lower.

Further, the pressure during the plasma irradiation onto the bonding surface 5a of the silicon oxide layer 5 may preferably be 100 Pa or lower and more preferably be 80 Pa or lower. The energy during the irradiation may preferably 30 to 120 W. Further, a product of the energy during the plasma irradiation and time duration of the irradiation may preferably be 1 Wh or less.

The bonding surface 1c of the piezoelectric material substrate 1 and bonding surface 6 of the silicon oxide layer 5 are contacted and bonded with each other. Thereafter, annealing treatment may preferably be performed to improve the bonding strength. The temperature during the annealing may preferably be 100° C. or higher and 300° C. or lower.

The bonded bodies 7 and 7A of the present invention may preferably be applied for an acoustic wave device 10.

As an acoustic wave device 10, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric material substrate. By applying high frequency signal on the IDT electrode on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A material forming the electrodes (electrode pattern) 8 of the piezoelectric material substrate may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Experiment A

It was produced a bonded body 7A shown in FIG. 3(b), according to the method described referring to FIGS. 1 to 3.

Specifically, it was prepared a 42Y-cut LiTaO₃ substrate (piezoelectric material substrate) 1 having a thickness of 0.2 mm and both main surfaces polished into mirror surfaces and a high-resistance Si substrate (supporting substrate) 4 having a thickness of 0.5 mm. A silicon oxide layer 5 was film-formed by sputtering in a thickness of 0.5 μm on the supporting substrate 4.

The bonding surface 1a of the piezoelectric material substrate 1 and the bonding surface 5a of the silicon oxide layer 5 on the supporting substrate 4 were subjected to cleaning and surface activation, respectively. Specifically, ultrasonic cleaning using pure water was performed, and the substrate surfaces were dried by spin dry. The supporting substrate 4 after the cleaning was then introduced into a plasma activation chamber, and the bonding surface 5a was activated by oxygen gas plasma at 30° C. Further, the piezoelectric material substrate 1 was similarly introduced into the plasma activation chamber, and the bonding surface 1a was subjected to surface activation by oxygen gas plasma at 30° C. The ultrasonic cleaning and spin dry as described above were performed again for removing particles adhered during the surface activation.

Further, the time duration of the activation was changed as shown in table 1. The energy of the plasma irradiation during the activation treatment was made 150 W. Further, the surface resistivity of the piezoelectric material substrate 1 after the activation was measured, and the measurement results were shown in table 1. Then, the surface resistivity of the piezoelectric material substrate 1 on the side of the silicon oxide layer 5 was measured by using "Hiresta UX MCP-HT800" supplied by NittoSeiko Analytic Co. Ltd. and a probe equipped with a guarded-electrode and by applying a voltage of 1000 V.

Then, the positioning of the respective substrates 1 and 4 were performed, and the activated bonding surface 1c of the piezoelectric material substrate 1 and the activated bonding surface 6 of the silicon oxide layer 5 were contacted with each other at room temperature. The substrates were contacted with the piezoelectric material substrate 1 positioned upper side. As a result, it was observed the state (so called-bonding wave) that the adhesion of the substrates 1 and 4 was spreading, indicating that good preliminary bonding was completed. Then, the bonded body was charged into an oven filled with nitrogen atmosphere and held at 120° C. for 10 hours, for improving the bonding strength. Further, before the substrates were charged into an oven at a high temperature, the substrates were divided into eight equal parts along radiation lines radiated from the center for preventing the fracture of the substrates due to thermal stress. The annealing temperature in the oven was 250° C. The bonding strength was evaluated by blade test (Semiconductor Wafer Bonding, Q.-Y. Tong & U. Gösele, p25) for eight bonded bodies drawn from the heating oven.

Thereafter, the surface 1b of the piezoelectric material substrate 1 of the bonded body 7 after the heating was subjected to grinding, lapping and CMP processes to thin the piezoelectric material substrate 1A. Electrodes 8 made of aluminum metal were provided on the surface 1d of the polished piezoelectric material substrate 1A by photolithography process. The period λ of the electrodes was made 5 μm so that the oscillation frequency was 850 MHz. The thickness of the electrodes 8 was made 200 nm, and reflectors of 80 pairs were provided on both sides of the 200 pairs of the electrodes 8 to produce an acoustic wave device 10 (SAW resonator) of 1 port. The impedance characteristics of the thus produced acoustic wave device 10 (SAW resonator) was measured by a network analyzer "E5071C" supplied by Agilent Co. Ltd.. As a result, it was observed a resonance peak (fs) around 820 MHz and an anti-resonance peak (fr) around 850 to 860 MHz. It was measured a difference of Δf the resonance frequency fs and anti-resonance frequency fr. It is generally known that the difference Δf is proportional to an electromechanical coupling factor k2 of an acoustic device. The results were shown in table 1.

TABLE 1

| Time duration for Activation treatment (Minutes) | Surface resistivity of Piezoelectric material substrate (Ω/□) | Δf (MHz) | Δf (%) | Bonding Strength (J/m²) |
|---|---|---|---|---|
| 0.1 | 1.24E+13 | 32.4 | 3.8% | 0.1 |
| 0.5 | 1.80E+13 | 31.8 | 3.7% | 2.4 |
| 1 | 3.10E+13 | 32.3 | 3.8% | 2.3 |
| 2 | 5.50E+13 | 32.8 | 3.9% | 2.7 |
| 5 | 1.40E+14 | 34.3 | 4.0% | 3.1 |
| 10 | 4.80E+14 | 33.5 | 3.9% | 2.9 |
| 15 | 8.80E+14 | 34.3 | 4.0% | 2.5 |
| 30 | 1.73E+15 | 38.8 | 4.6% | 2.6 |
| 60 | 6.80E+15 | 39.4 | 4.6% | 2.6 |
| 120 | 7.80E+15 | 39.2 | 4.6% | 2.5 |
| 150 | 1.51E+16 | 39.6 | 4.7% | 2.2 |

As shown in table 1, in the case that the time duration of activation is short (0.1 to 15 minutes), the surface resistivity of the piezoelectric material substrate 1A on the side of the silicon oxide 5 was proved to be about $1.2 \times 10^{13}$ Ω/□ to $8.8 \times 10^{14}$ Ω/□ and Δf (MHz) was as low as 31.8 to 34.3. As a result, Δf (%)=Δf (MHz)/850 (MHz) was proved to be 3.7% to 4.0%.

On the other hand, in the case that the time duration of the activation is long (30 minutes to 150 minutes), the surface resistivity of the piezoelectric material substrate 1A on the side of the silicon oxide layer 5 was proved to be about $1.73 \times 10^{15}$ Ω/□ to $1.51 \times 10^{16}$ Ω/□ and Δf (MHz) was proved to be 38.8 to 39.6. As a result, Δf (%)=Δf (MHz)/850 (MHz) was proved to be about 4.6% to 4.7%.

Further, in the case that the surface resistivity of the piezoelectric material substrate 1A on the side of the silicon oxide layer 5 exceeds $2 \times 10^{16}$ Ω/□, the bonding strength was considerably reduced. Thus, the reduction of the thickness of the piezoelectric material substrate 2A resulted in the separation.

As a result, in the case that the bonding surface 1a of the piezoelectric material substrate 1 was subjected to surface activation with oxygen plasma so that the surface resistivity was made $1.7 \times 10^{15}$ Ω/□ or higher and $1.6 \times 10^{16}$ Ω/□ or lower according to the present invention, the bonding strength was maintained so that the thickness of the piezoelectric material substrate 1 can be made smaller and the deterioration of performance (for example, electromechanical coupling factor k2) of the bonded body can be suppressed.

Experiment B

In the experiment A, the material of the piezoelectric material substrate 1 was changed to lithium niobate. As a result, it was obtained similar results as those of the experiment A.

The invention claimed is:

1. A method of producing a bonded body of a piezoelectric material substrate and a supporting substrate with a silicon oxide layer provided thereon, said piezoelectric material substrate comprising a material selected from the group consisting of lithium niobate, lithium tantalate and lithium niobate-lithium tantalate, the method comprising the steps of:
   irradiating an oxygen plasma onto a bonding surface of said piezoelectric material substrate at a temperature of 150° C. or lower to make a surface resistivity at said bonding surface $1.7 \times 10^{15}$ Ω/□ or higher; and
   then bonding said bonding surface of said piezoelectric material substrate to a bonding surface of said silicon oxide layer.

2. The method of claim 1, wherein an oxygen plasma is irradiated onto said bonding surface of said silicon oxide layer at a temperature of 150° C. or lower to activate said bonding surface of said silicon oxide layer and wherein said bonding surface of said piezoelectric material substrate is then bonded to said bonding surface of said silicon oxide layer.

3. The method of claim 1, further comprising the step of:
   reducing a thickness of said piezoelectric material substrate by polishing after said bonding surface of said piezoelectric material substrate is bonded to said bonding surface of said silicon oxide layer.

4. The method of claim 3, wherein said thickness of said piezoelectric material substrate is reduced to 2 μm or smaller by polishing.

5. The method of claim 1, wherein said supporting substrate comprises a material selected from the group consisting of silicon, quartz, sialon, mullite, sapphire and translucent alumina.

\* \* \* \* \*